United States Patent [19]
González

[11] Patent Number: 5,227,325
[45] Date of Patent: Jul. 13, 1993

[54] METHOD OF FORMING A CAPACITOR

[75] Inventor: Fernando González, Boise, Id.

[73] Assignee: Micron Technology, Incl, Boise, Id.

[21] Appl. No.: 862,526

[22] Filed: Apr. 2, 1992

[51] Int. Cl.$^5$ .......................................... H01L 21/70
[52] U.S. Cl. ........................................ 437/52; 437/47;
437/60; 437/192; 437/919
[58] Field of Search .................. 437/47, 48, 52, 60,
437/192, 200, 228, 233, 235, 919; 357/23.6

[56] References Cited

U.S. PATENT DOCUMENTS

| | | | |
|---|---|---|---|
| 4,267,012 | 5/1981 | Pierce et al. | 437/192 |
| 4,753,709 | 6/1988 | Welch et al. | 437/192 |
| 4,784,973 | 11/1988 | Stevens et al. | 437/192 |
| 4,970,564 | 11/1990 | Kimura et al. | 357/23.6 |
| 4,981,816 | 1/1991 | Kim et al. | 437/192 |
| 5,094,965 | 3/1992 | Ozaki et al. | 437/192 |

FOREIGN PATENT DOCUMENTS

| | | | |
|---|---|---|---|
| 0291146 | 12/1987 | Japan | 437/192 |
| 0267730 | 5/1988 | Japan | 437/192 |
| 0131537 | 6/1988 | Japan | . |
| 0265535 | 10/1989 | Japan | . |
| 0265541 | 10/1989 | Japan | 437/192 |
| 0388075 | 9/1990 | Japan | . |
| 0251139 | 10/1990 | Japan | 437/193 |

*Primary Examiner*—Tom Thomas
*Attorney, Agent, or Firm*—Wells, St. John, Roberts, Gregory & Matkin

[57] ABSTRACT

A method of forming memory cell capacitors without using a buried capacitor contact mask includes the following steps: a) providing an array of electrically insulated word lines atop a semiconductor wafer; b) defining first active regions adjacent the word lines for connection with memory cell capacitors; c) defining second active regions adjacent the word lines for electrical connection with bit lines; d) etching to upwardly expose the first active regions without use of photomasking; e) depositing to a selected thickness a layer of first conductive material atop the wafer to conductively connect with the first active regions, the first conductive material being selectively etchable relative to silicon with silicon being selectively etchable relative to the first conductive material; f) providing a layer of electrically conductive storage node polysilicon atop the layer of first conductive material; g) etching the storage node polysilicon layer selectively relative to the first conductive material to define isolated capacitor storage nodes; h) depositing a layer of capacitor dielectric atop the isolated capacitor storage nodes; i) providing a layer of electrically conductive cell polysilicon atop the capacitor dielectric layer; and j) selectively etching exposed first conductive material from underlying substrate.

28 Claims, 7 Drawing Sheets

METHOD OF FORMING A CAPACITOR

TECHNICAL FIELD

This invention relates generally to the fabrication of three dimensional stacked capacitors.

BACKGROUND OF THE INVENTION

As DRAMs increase in memory cell density, there is a continuous challenge to maintain sufficiently high storage capacitance despite decreasing cell area. Additionally, there is a continuing goal to further decrease cell area. A principal way of increasing cell capacitance is through cell structure techniques. Such techniques include three dimensional cell capacitors, such as trenched or stacked capacitors. This invention concerns stacked capacitor cell constructions.

With the conventional stacked capacitor, the capacitor is formed immediately above and electrically connected to the active device area of the associated MOS transistor of the memory cell. Problems associated with the prior art are described with reference to FIGS. 1–3. FIG. 1 illustrates a semiconductor wafer fragment 10 comprised of a bulk substrate 12, a pair of adjacent word lines 14, 16, and field oxide region 18. The illustrated region between word lines 14 and 16 will be utilized for formation of a stacked capacitor construction. The area to the left of word line 14, will be utilized for a bit line contact.

Substrate 12 is comprised of a p-type material having a p-type dopant concentration of approximately $2 \times 10^{15}$ atoms/cm$^3$, with the intent being to form n-channel transistors utilizing word lines 14 and 16. Such word lines are comprised of a conventional construction of gate oxide 20, conductively doped polysilicon 22, a more highly conductive silicide layer 24, and an overlying insulating oxide cap 26. Pairs 28, 30 of anisotropically etched side wall spacers are provided about outer edges of word lines 14 and 16. Such function to insulate the sides of word lines 14 and 16, and in the course of processing provide desired spacing for formation of LDD regions. Yet, only one pair of side wall spacers would be needed to insulate about the word lines. The extra side wall spacer is provided to facilitate formation of the desired LDD construction for proper circuit operation.

More specifically and prior to any spacer formation, a p-type LDD halo implant at a dose of approximately $4 \times 10^{12}$ atoms/cm$^2$ is provided into bulk substrate 22 to provide halo regions 32. Such constitute a part of an LDD construction. Thereafter, a layer of insulating material, typically SiO$_2$, is deposited atop the wafer and anisotropically etched to form spacer pairs 28. Thereafter, an n-type LDD implant is conducted at a typical dose of $1.5 \times 10^{13}$ atoms/cm$^2$ to produce regions 34, as shown. Such constitute a further aspect of an LDD construction, as is known by people of skill in the art. Thereafter, another layer of insulating material, such as SiO$_2$, is deposited and anisotropically etched to produce spacer pairs 30. Thereafter, a heavy n+ implant, typically at a dose of $8 \times 10^{15}$ atoms/cm$^2$, is provided to form high concentration n+ regions 36. Such regions 36 will be utilized to connect with bit lines and for capacitor formation. The process typically next continues by depositing and planarizing a layer 38 of insulating material.

Note that the immediately described technique requires added spacing between adjacent word lines 14 and 16 as a result of space being consumed by extra spacer regions 30 between each pair of word lines.

Referring to FIG. 2, insulating layer 38 is typically patterned and etched to produce a contact opening 40 which extends downwardly to active region 36 between word lines 14 and 16 for ultimate formation of a capacitor construction.

Referring to FIG. 3, next a layer 42 of polysilicon is deposited and patterned as illustrated to define isolated capacitor storage nodes. Polysilicon layer 42 is doped with an electrically conductive enhancing impurity to render such region electrically conductive. During such doping, a problem exists in preventing the doping impurity from migrating downwardly into the illustrated active region 36. Thereafter, a thin capacitor dielectric layer 44, followed by a thicker capacitor cell polysilicon layer 46, is deposited to complete construction of the capacitor.

It would be desirable to improve upon these and other aspects of three dimensional stacked capacitor constructions.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
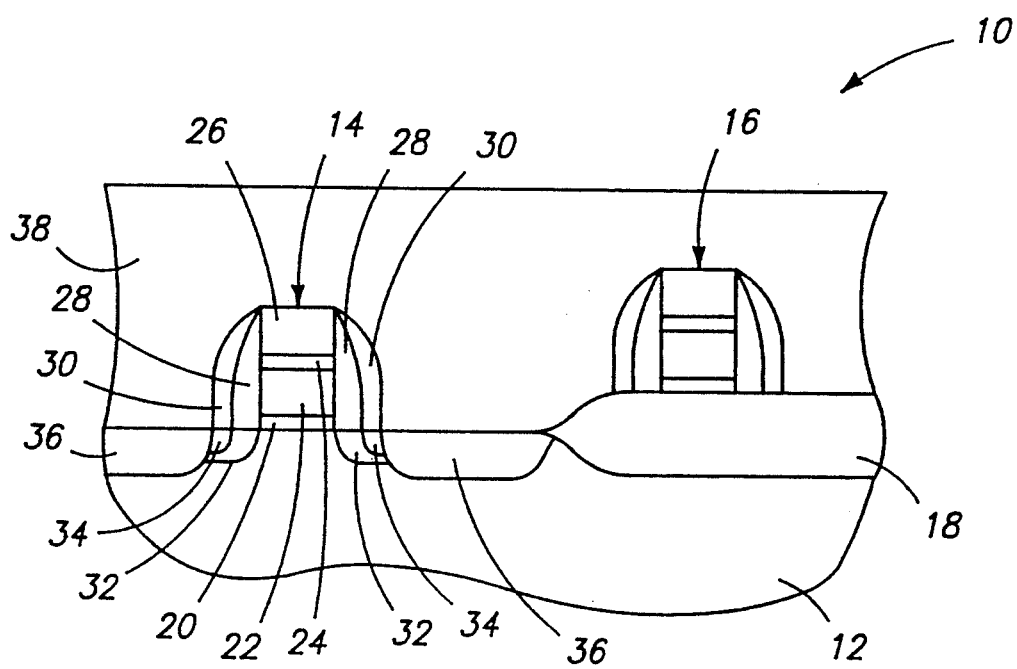
FIG. 1 is a sectional view of a prior art wafer fragment at one processing step in accordance with prior art methods, and is discussed in the "Background" section above.

This disclosure of the invention is submitted in furtherance of the constitutional purposes of the U.S. Patent Laws "to promote the progress of science and useful arts" (Article 1, Section 8).

In accordance with one aspect of the invention, a method of forming memory cell capacitors comprises the following steps:

providing an array of electrically insulated word lines atop a semiconductor wafer;

defining first active regions adjacent the word lines for connection with memory cell capacitors;

defining second active regions adjacent the word lines for electrical connection with bit lines;

etching to upwardly expose the first active regions without use of photomasking;

depositing to a selected thickness a layer of first conductive material atop the wafer to conductively connect with the first active regions, the first conductive material being selectively etchable relative to silicon with silicon being selectively etchable relative to the first conductive material;

providing a layer of electrically conductive storage node polysilicon atop the layer of first conductive material;

etching the storage node polysilicon layer selectively relative to the first conductive material to define isolated capacitor storage nodes;

depositing a layer of capacitor dielectric atop the isolated capacitor storage nodes;

providing a layer of electrically conductive cell polysilicon atop the capacitor dielectric layer; and selectively etching exposed first conductive material from underlying substrate.

In accordance with another aspect of the invention, a method of forming memory cell capacitors over n-channel transistors comprises the following steps:

providing an array of word lines atop a semiconductor wafer, and defining first regions adjacent the word lines for formation of first n-channel active areas for electrical connection with memory cell capacitors, and defining second regions adjacent the word lines for formation of second n-channel active areas for electrical connection with bit lines;

conducting a p-type LDD halo implant into the second regions for use in formation of LDD regions for the second n-channel active areas;

depositing a first layer of insulating material to a selected thickness over the word lines and halo implanted second regions;

anisotropically etching the layer of insulating material to define first word line sidewall spacers and to upwardly expose the first and second regions;

after first spacer formation, conducting an n− LDD implant into the first and second regions;

depositing a second layer of insulating material to a selected thickness over the word lines and n− LDD implanted first and second regions;

etching the second layer of insulating material to define second word line spacers over the first word line spacers;

etching the second layer of material to re-expose the first regions;

conducting an n+ implant into the second regions;

depositing to a selected thickness a layer of first conductive material atop the wafer to conductively connect with the first regions, the first conductive material being selectively etchable relative to silicon with silicon being selectively etchable relative to the first conductive material;

providing a layer of storage node polysilicon doped with a conductivity enhancing impurity atop the layer of first conductive material, the layer of first conductive material functioning as a diffusion barrier for restricting the conductivity enhancing impurity from migrating downwardly into the wafer;

etching the storage node polysilicon layer selectively relative to the first conductive material to define isolated capacitor storage nodes;

etching exposed first conductive material from underlying substrate;

depositing a layer of capacitor dielectric atop the isolated capacitor storage nodes;

depositing a layer of cell polysilicon atop the capacitor dielectric layer;

etching the cell polysilicon selectively relative to the capacitor dielectric layer to define memory cell capacitors which electrically connect with the first active regions; and etching the capacitor dielectric selectively relative to underlying substrate.

Preferably, the second layer of insulating material comprises a sacrificial layer which is selectively etchable relative to silicon and the first insulating material for removal. Such material is removed after LDD implant formation, enabling the word lines to be spaced closer together where capacitor contacts are to be made. An aspect of the invention also includes forming memory cell capacitors without using a buried capacitor contact mask.

Figure 2:
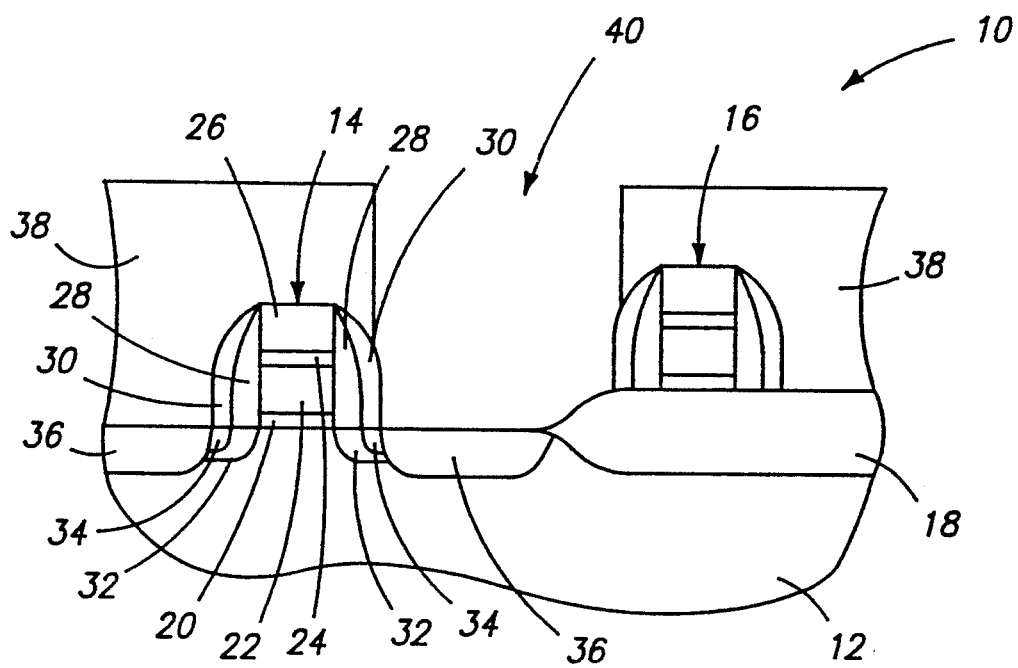
FIG. 2 is a view of the FIG. 1 wafer at a prior art processing step subsequent to that illustrated by FIG. 1.
Figure 3:
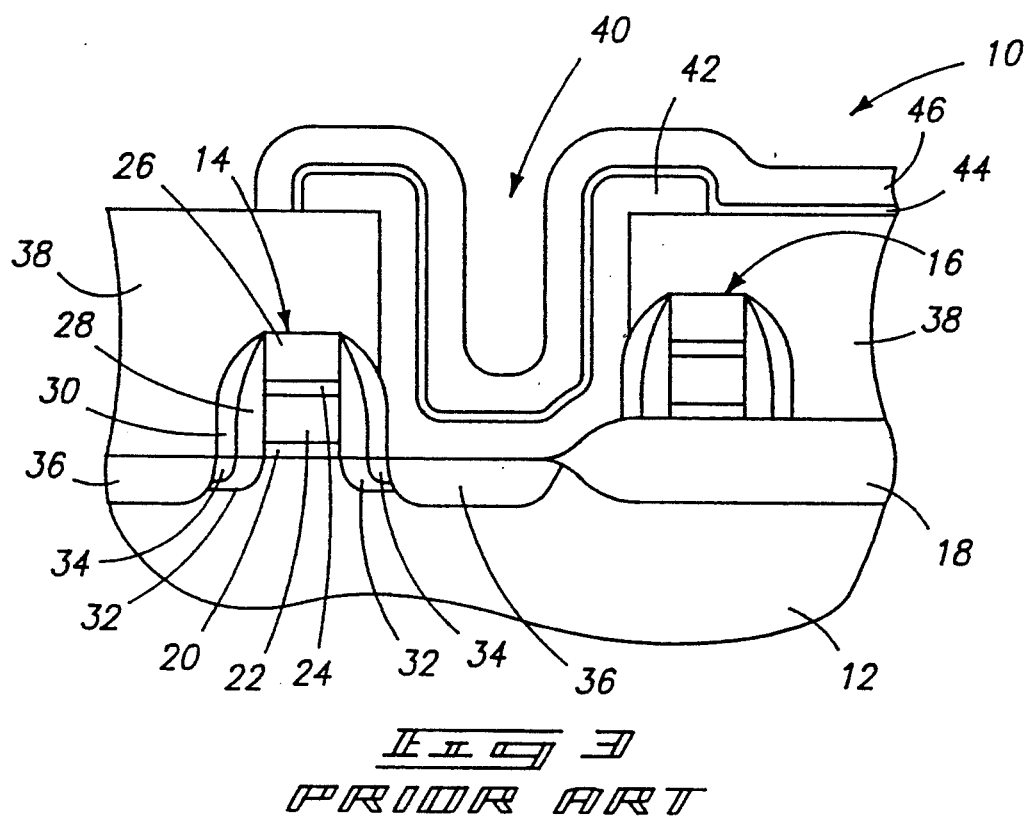
FIG. 3 is a view of the FIG. 1 wafer at a prior art processing step subsequent to that illustrated by FIG. 2.
Figure 4:
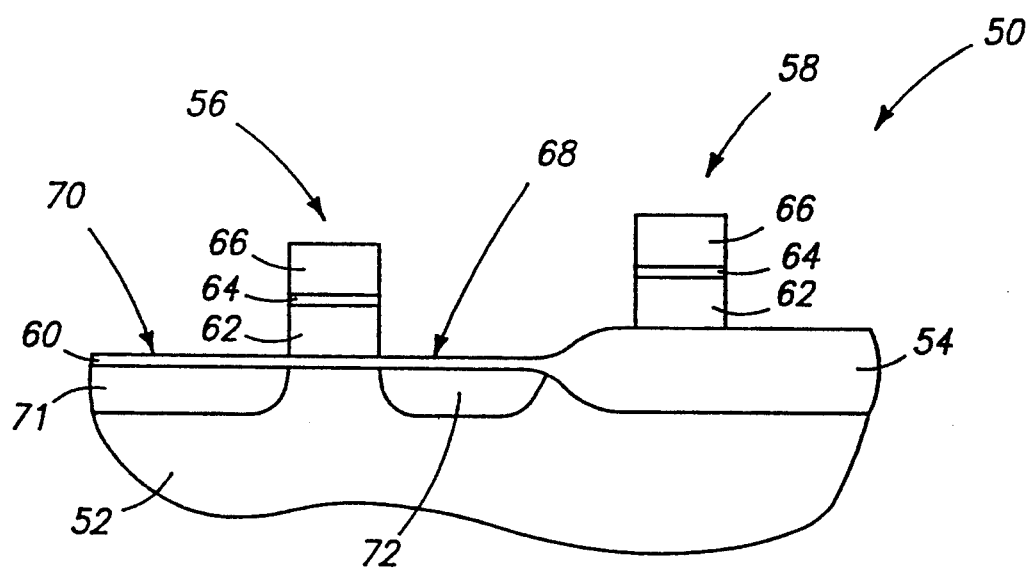
FIG. 4 is a diagrammatic sectional view of a semiconductor wafer at one processing step in accordance with the invention.

More particularly and with reference to the figures, FIG. 4 illustrates a semiconductor wafer fragment 50 comprised of a bulk substrate region 52, field oxidation region 54, and a pair of word lines 56, 58. Substrate 52 would typically comprise a p- silicon substrate having a p-type dopant concentration of approximately $2 \times 10^{15}$ atoms/cm$^3$. Word lines 56 and 58 are comprised of a gate oxide region 60, conductively doped polysilicon region 62, a metal silicide layer 64 and an overlying oxide cap 66. Layers 66, 64 and 62 have been patterned as shown to define word line outlines 56, 58. Word lines 56 and 58 are patterned to define first regions 68 for formation of first n-channel active areas for electrical connection with memory cell capacitors, and to define second regions 70 for formation of second n-channel active areas for electrical connection with bit lines. Also note that word lines 56 and 58 are positioned closer together than word lines 14 and 16 of the prior art FIGS. 1-3 construction.

A punch-through, p-type LDD halo implant is conducted through gate oxide layer 60 into at least second region 70 to define an implant region 71 for use in formation of LDD regions for the second n-channel active areas. An opposing implant region 72 is also defined. An example dopant would be boron implanted at an energy of 50 KeV at a dose of $4 \times 10^{12}$ atoms/cm$^2$.

Figure 5:
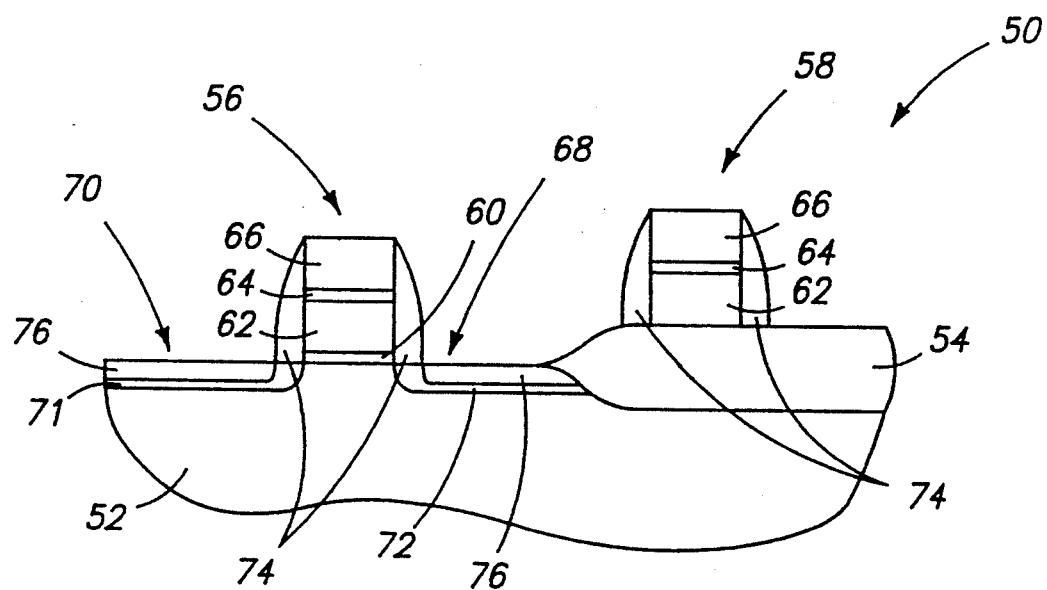
FIG. 5 is a view of the FIG. 4 wafer at a processing step subsequent to that shown by FIG. 4.

Referring to FIG. 5, a first layer of insulating material, such as SiO$_2$ by decomposition of TEOS, is deposited to a selected thickness over word lines 56 and 58 and halo implanted second regions 70. A preferred thickness for such first layer of insulating material is 1500 Angstroms. Such layer is anisotropically etched to define first word line side wall spacers 74 and to remove gate oxide layer 60 to upwardly expose first region 68 and second region 70. Such an anisotropic etch enables first region 68 to be upwardly exposed without use of a photomasking step. At this point in the process, word lines 56 and 58 are substantially electrically insulated, but for electrical activity through gate oxide 60 to the gate region of bulk substrate 52 therebeneath. After spacer 74 formation, an n− LDD implant is conducted into first region 68 and second region 70 to define n− regions 76. An example deposition would be to provide a phosphorus dopant at 100 KeV at a dose of $1.5 \times 10^{13}$.

Figure 6:
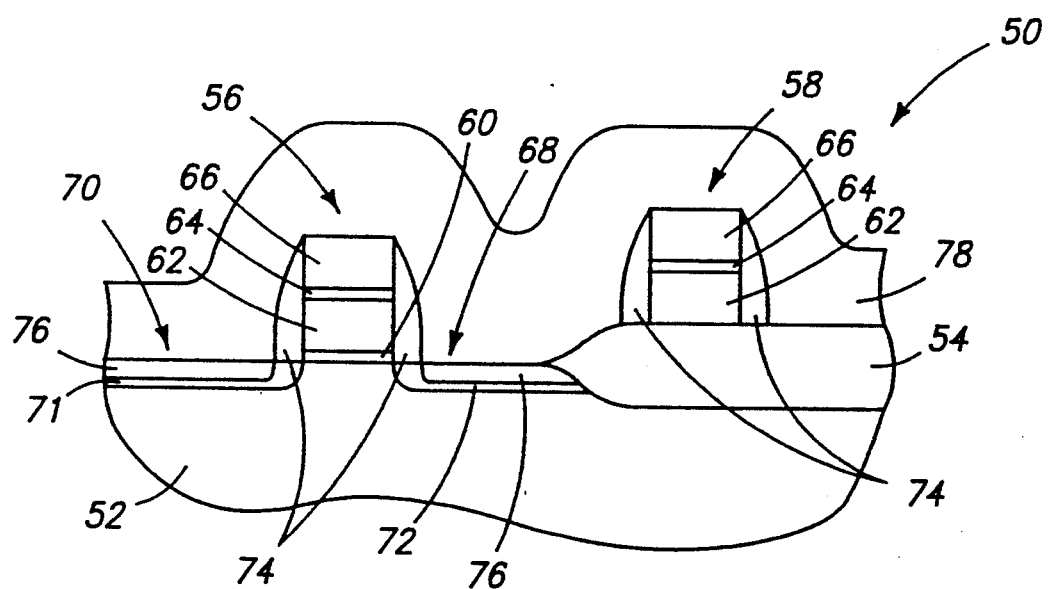
FIG. 6 is a view of the FIG. 4 wafer at a processing step subsequent to that shown by FIG. 5.

Referring to FIG. 6, a second layer 78 of material is provided to a selected thickness over word lines 56, 58 and n− LDD implanted first and second regions 76. Preferably, layer 78 is sacrificial (i.e., it will at some point be removed from the wafer) and is therefore selectively etchable relative to the silicon of substrate 52 and selectively etchable relative to the first insulating material of spacers 74. The material of layer 78 would preferably be an insulating material were such layer to not be removed from the wafer. A preferred material for layer 78 which is selectively etchable relative to oxide and to silicon would be a nitride, such as $Si_3N_4$.

Where layer 78 is sacrificial, its selected thickness is preferably provided to be great enough to substantially fill the area or space between word lines 56 and 58. An example separation distance between the edges of the conductive material of word lines 56 and 58 where layer 78 is to be sacrificial would be 0.5 micron. Example most preferred conditions where spacers 74 are 1500 Angstroms in thickness would be a thickness of layer 78 of approximately 2500 Angstroms. Preferably, the sum of the selected thicknesses of the first layer utilized to define spacer 74 and the second layer 78 is from about 2000 Angstroms to about 4000 Angstroms. More specifically, word lines 56 and 58 typically have a first selected spacing between one another where a capacitor is to be formed. The spacing between adjacent word lines where bit line contacts are to be formed typically is some selected spacing over second region 70 which is greater than the spacing between word lines overlying first region 68. The thickness of layer 78 is preferably selected to be greater than or equal to about one-half of the spacing between the illustrated word lines 56 and 58 to essentially fill the area therebetween, as shown in FIG. 6.

Figure 7:
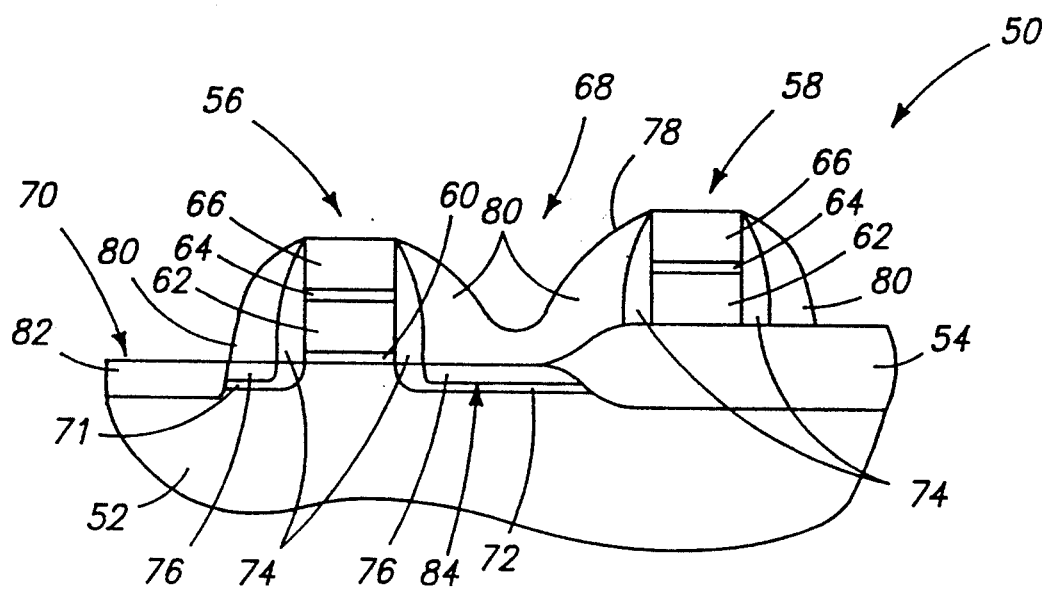
FIG. 7 is a view of the FIG. 4 wafer at a processing step subsequent to that shown by FIG. 6.

Referring to FIG. 7, layer 78 is anisotropically etched to define second word line spacers 80 over first word line spacers 74. Such etching re-exposes second regions 70 for subsequent implantation. Note also in the described embodiment that the thickness of layer 78 between word lines 56 and 58 prevents re-exposing of first region 68 to implantation at this point in the process. An n+ implant is conducted into second regions 70 to define an n+ active region 82. An example dopant would be phosphorus or arsenic at a power of 35 KeV and a dose of $8 \times 10^{15}$ atoms/cm$^2$. Note that the n− implant which produced region 76 in first region 68 will be sufficient to define a functional active area 84. This thereby will result in an asymmetrical transistor. Sacrificial layer 78 in the form of remaining spacers 80 is then preferably etched from the wafer to re-expose first regions 68. A example technique would be to conduct a wet nitride etch utilizing using a hot phosphoric acid bath.

Figure 8:
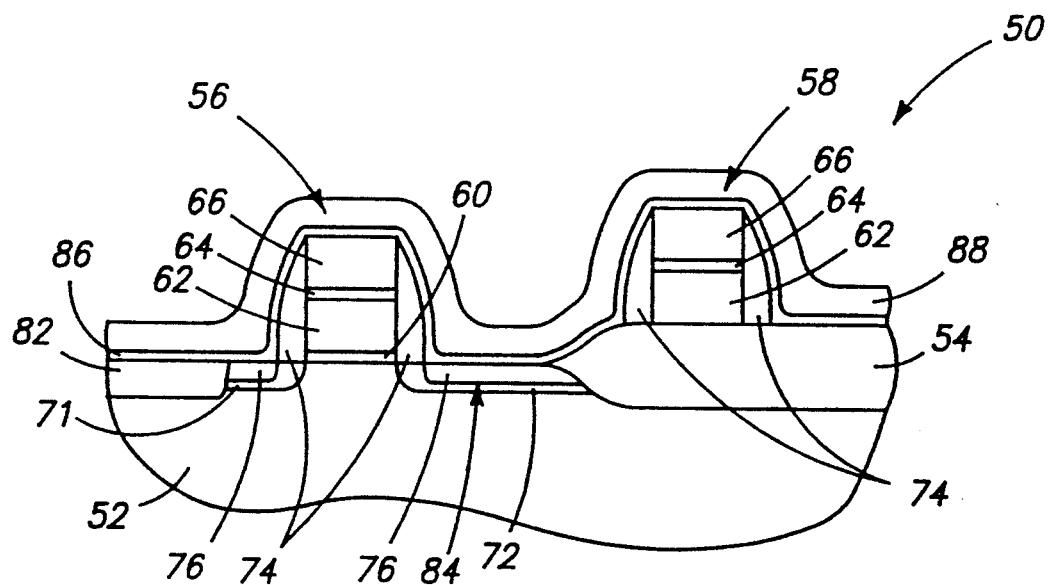
FIG. 8 is a view of the FIG. 4 wafer at a processing step subsequent to that shown by FIG. 7.

Referring to FIG. 8, a layer 86 of first conductive material is deposited to a selected thickness atop the wafer to conductively connect with the first active region 84. The first conductive material is selectively etchable relative to silicon with silicon also being selectively etchable relative to the first material. Preferably, the first conductive material comprises a transition metal silicide or a transition metal nitride. Example transition metals include W, Mo, Ta, Ti, Pa, Pt, Ni and Co. An example most preferred material comprises titanium nitride. The preferred thickness for layer 86 is from about 200 Angstroms to about 1000 Angstroms, with about 300 Angstroms being most preferred.

Thereafter, a layer 88 of storage node polysilicon conductively doped with a conductivity enhancing impurity (such as phosphorus) is provided atop layer 86. Typically, polysilicon is first deposited, and thereafter doped with the conductivity enhancing impurity. Layer 86 functions at least in part as a diffusion barrier for restricting the conductivity enhancing impurity from migrating downwardly into the wafer and correspondingly active regions 82 and 84. To prevent any tendency of the preferred nitride material of layer 86 from converting to a metal silicide because of the presence of polysilicon, polysilicon layer 88 is preferably deposited at a lower than conventional temperature, such as at a temperature of less than or equal to 550° C. Polysilicon layer 88 can be doped with phosphorus, as well as in situ doped with arsenic, or implanted with arsenic.

Figure 9:
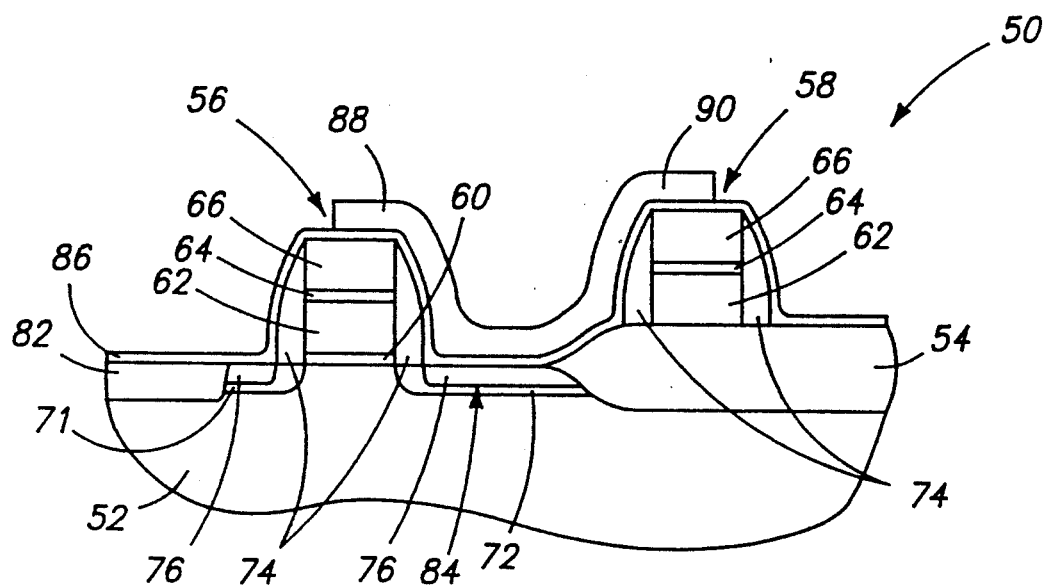
FIG. 9 is a view of the FIG. 4 wafer at a processing step subsequent to that shown by FIG. 8.

Referring to FIG. 9, polysilicon layer 88 is etched selectively relative to the first conductive material of layer 86 to define isolated storage nodes, such as storage node 90. An example wet etch chemistry would be a mixture of HF and $HNO_3$ in deionized water, with the layer 86 acting as an effective wet etch stop. Note that at this point through the process, storage nodes 90 have been defined and patterned without any previous capacitor buried contact photolithography masking.

Figure 10:
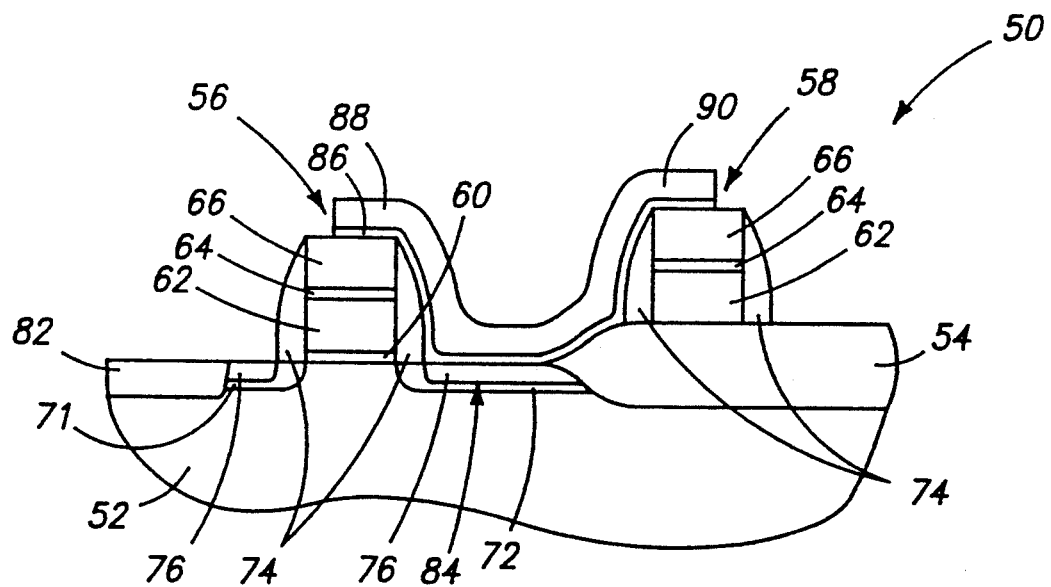
FIG. 10 is a view of the FIG. 4 wafer at a processing step subsequent to that shown by FIG. 9.

Referring to FIG. 10, the wafer is subjected to a dilute wet etch, using for example sulfuric acid and hydrogen peroxide, to remove remaining exposed first conductive material 86.

Figure 11:
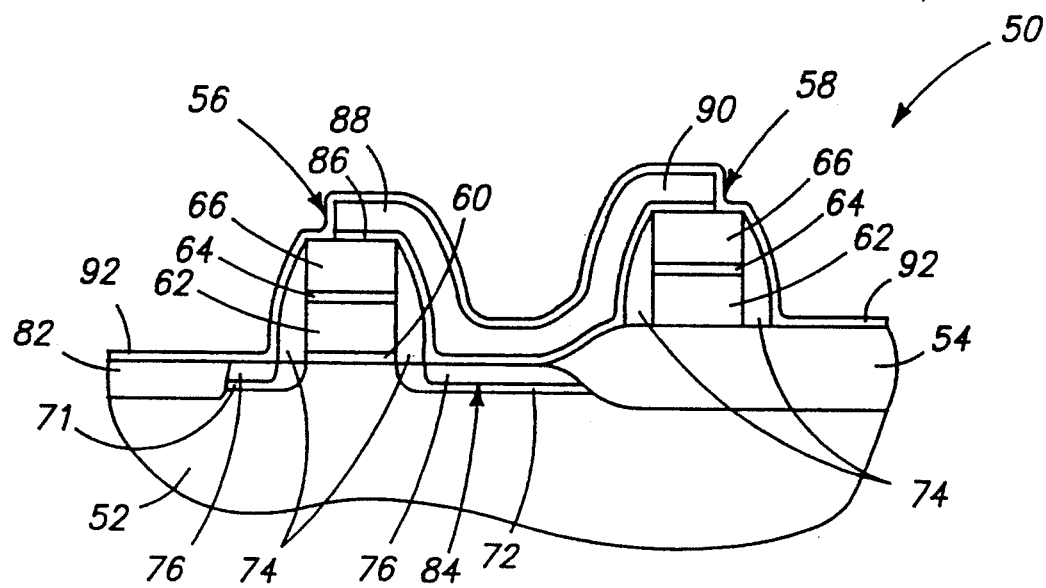
FIG. 11 is a view of the FIG. 4 wafer at a processing step subsequent to that shown by FIG. 10.

Referring to FIG. 11, a thin (100 Angstroms) layer 92 of capacitor nitride dielectric is deposited, and thereafter subjected to a conventional anneal to form an ONO capacitor dielectric construction.

Figure 12:
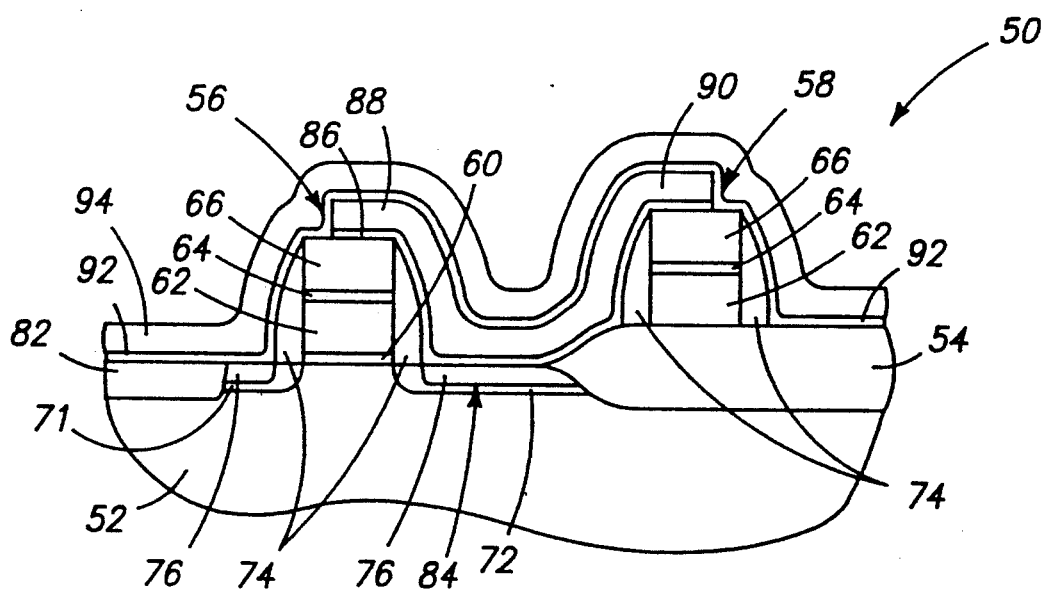
FIG. 12 is a view of the FIG. 4 wafer at a processing step subsequent to that shown by FIG. 11.

Referring to FIG. 12, a layer 94 of conductively doped polysilicon is provided atop cell capacitor dielectric layer 92. Preferably, polysilicon layer 94 is deposited at a lower than conventional temperature, such as at a temperature of less than or equal to 550° C.

Figure 13:
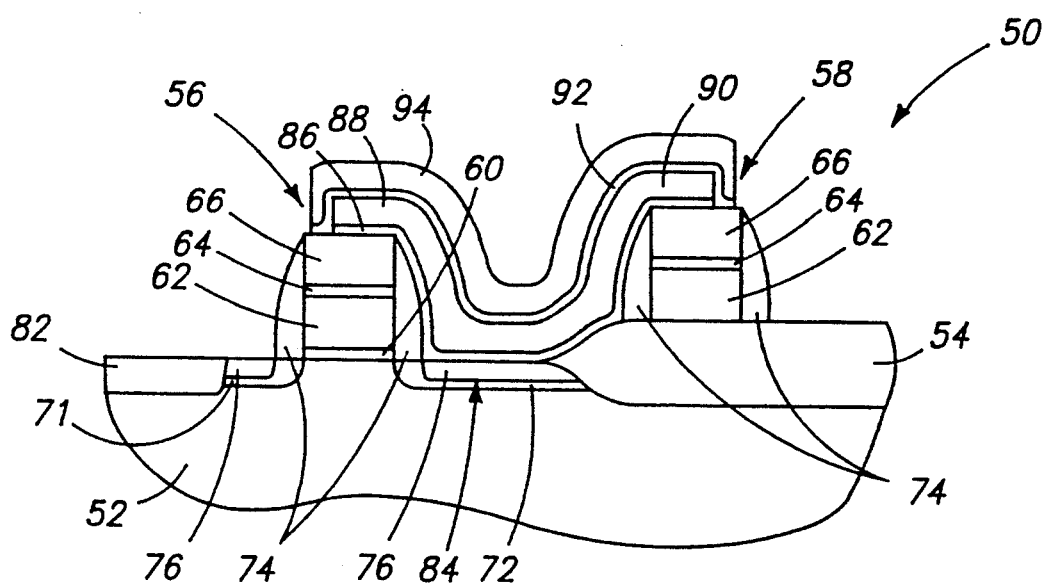
FIG. 13 is a view of the FIG. 4 wafer at a processing step subsequent to that shown by FIG. 12.

Referring to FIG. 13, cell poly layer 94 is patterned and etched, as desired, selectively relative to underlying nitride. Exposed capacitor dielectric layer 92 (nitride) is thereafter selectively etched from underlying substrate. In this described preferred embodiment, the capacitor dielectric is etched last to prevent polysilicon layer 94 from overlying silicon substrate which would make any attempt at selective removal impractical.

The material of first layer 86 in retarding out diffusion of phosphorus into the storage node junction allows the buried contact area to be closer to the access transistor without affecting $V_t$. Additionally, use of sacrificial layer 78 to form spacers 80 further enables density increase, by enabling the spacing between word lines 56 and 58 to be smaller. Alternately, such sacrificial spacers enable the utilizable capacitor buried contact area to be larger. Further, the above-described process reduces or removes a mask step thereby making the first layer of capacitor polysilicon self-aligning with respect to the buried contact area.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A method of forming memory cell capacitors over n-channel transistors comprising the following steps:

providing an array of word lines atop a semiconductor wafer, and defining first regions adjacent the word lines for formation of first n-channel active areas for electrical connection with memory cell capacitors, and defining second regions adjacent the word lines for formation of second n-channel active areas for electrical connection with bit lines;

conducting a p-type LDD halo implant into the second regions for use in formation of LDD regions for the second n-channel active areas;

depositing a first layer of insulating material to a selected thickness over the word lines and halo implanted second regions;

anisotropically etching the layer of insulating material to define first word line sidewall spacers and to expose the first and second regions;

after first spacer formation, conducting an n− LDD implant into the first and second regions;

depositing a second layer of insulating material to a selected thickness over the word lines and n− LDD implanted first and second regions;

etching the second layer of insulating material to define second word line spacers over the first word line spacers;

etching the second layer of material to re-expose the first regions;

conducting an n+ implant into the second regions;

depositing to a selected thickness a layer of first conductive material atop the wafer to conductively connect with the first regions, the first conductive material being selectively etchable relative to silicon with silicon being selectively etchable relative to the first conductive material;

providing a layer of storage node polysilicon doped with a conductivity enhancing impurity atop the layer of first conductive material, the layer of first conductive material functioning as a diffusion barrier for restricting the conductivity enhancing impurity from migrating downwardly into the wafer;

etching the storage node polysilicon layer selectively relative to the first conductive material to define isolated capacitor storage nodes and exposed first conductive material;

etching at least some of the exposed first conductive material from underlying substrate;

depositing a layer of capacitor dielectric atop the isolated capacitor storage nodes;

depositing a layer of cell polysilicon atop the capacitor dielectric layer;

etching the cell polysilicon selectively relative to the capacitor dielectric layer to define memory cell capacitors which electrically connect with the first active regions; and etching the capacitor dielectric selectively relative to underlying substrate.

2. The method of forming memory cell capacitors of claim 1 wherein the second layer of insulating material comprises a nitride.

3. The method of forming memory cell capacitors of claim 1 wherein the sum of the selected thicknesses of the first and second layers of insulating materials is from about 2000 Angstroms to about 4000 Angstroms.

4. The method of forming memory cell capacitors of claim 1 wherein the sum of the selected thicknesses of the first and second layers of insulating materials is from about 2000 Angstroms to about 4000 Angstroms, and the second layer of insulating material comprises a nitride.

5. The method of forming memory cell capacitors of claim 1 wherein the first conductive material comprises a transition metal silicide or a transition metal nitride.

6. The method of forming memory cell capacitors of claim 1 wherein the first conductive material comprises TiN.

7. The method of forming memory cell capacitors of claim 1 wherein the selected thickness of the first conductive material is from about 200 Angstroms to about 1000 Angstroms.

8. The method of forming memory cell capacitors of claim 1 wherein the first conductive material comprises a transition metal silicide or a transition metal nitride, and the selected thickness of the first conductive material is from about 200 Angstroms to about 1000 Angstroms.

9. The method of forming memory cell capacitors of claim 1 wherein the first conductive material comprises TiN, and the selected thickness of the first conductive material is from about 200 Angstroms to about 1000 Angstroms.

10. The method of forming memory cell capacitors of claim 1 wherein the step of depositing the layer of storage node polysilicon comprises depositing polysilicon at a temperature of less than or equal to about 550° C.

11. A method of forming memory cell capacitors over n-channel transistors comprising the following steps:

a) providing an array of word lines atop a semiconductor wafer, and defining first regions adjacent the word lines for formation of first n-channel active areas for electrical connection with memory cell capacitors, and defining second regions adjacent the word lines for formation of second n-channel active areas for electrical connection with bit lines;

b) conducting a p-type LDD halo implant into the second regions for use in formation of LDD regions for the second n-channel active areas;

c) depositing a first layer of first insulating material to a selected thickness over the word lines and halo implanted second regions;

d) anisotropically etching the layer of insulating material to define first word line sidewall spacers and to expose the first and second regions;

e) after first spacer formation, conducting an n− LDD implant into the first and second regions;

f) depositing a sacrificial layer of material to a selected thickness over the word lines and n− LDD implanted first and second regions, the sacrificial layer being selectively etchable relative to silicon and the first insulating material;

g) anisotropically etching the sacrificial layer to define second sacrificial word line spacers over the first word line spacers;

h) conducting an n+ implant into the second regions;

i) selectively etching the sacrificial layer from the wafer to re-expose the first regions;

j) depositing to a selected thickness a layer of first conductive material atop the wafer to conductively connect with the first regions, the first conductive material being selectively etchable relative to silicon with silicon being selectively etchable relative to the first conductive material;

k) providing a layer of storage node polysilicon doped with a conductivity enhancing impurity atop the layer of first conductive material, the layer of first conductive material functioning as a diffusion barrier for restricting conductivity enhancing impurity from migrating downwardly into the wafer;

l) etching the storage node polysilicon selectively relative to the first conductive material to define isolated capacitor storage nodes and exposed first conductive material;

m) etching at least some of the exposed first conductive material from underlying substrate;

n) depositing a layer of capacitor dielectric atop the isolated capacitor storage nodes;

o) depositing a layer of cell polysilicon atop the capacitor dielectric layer;

p) etching the cell polysilicon selectively relative to the capacitor dielectric layer to define memory cell capacitors which electrically connect with the first active regions; and q) etching the capacitor dielectric selectively relative to underlying substrate.

12. The method of forming memory cell capacitors of claim 11 wherein the sacrificial layer of material comprises a nitride.

13. The method of forming memory cell capacitors of claim 1 wherein the sum of the selected thicknesses of the first layer of insulating material and sacrificial layer is from about 2000 Angstroms to about 4000 Angstroms.

14. The method of forming memory cell capacitors of claim 11 wherein adjacent word lines in the array have a first selected spacing between one another over the first regions and a second selected spacing between one another over the second regions, the selected thickness of the sacrificial layer being greater than or equal to about one-half the first selected spacing.

15. The method of forming memory cell capacitors of claim 11 wherein adjacent word lines in the array have a first selected spacing between one another over the first regions and a second selected spacing between one another over the second regions; the sacrificial layer of material comprises a nitride; and the selected thickness of the sacrificial nitride layer being greater than or equal to about one-half the first selected spacing.

16. The method of forming memory cell capacitors of claim 11 wherein adjacent word lines in the array have a first selected spacing between one another over the first regions and a second selected spacing between one another over the second regions; the sum of the selected thicknesses of the first layer of insulating material and sacrificial layer is from about 2000 Angstroms to about 4000 Angstroms; the sacrificial layer of material comprises a nitride; and the selected thickness of the sacrificial nitride layer being greater than or equal to about one-half the first selected spacing.

17. The method of forming memory cell capacitors of claim 11 wherein the first conductive material comprises a transition metal silicide or a transition metal nitride.

18. The method of forming memory cell capacitors of claim 11 wherein the first conductive material comprises TiN.

19. The method of forming memory cell capacitors of claim 11 wherein the selected thickness of the first conductive material is from about 200 Angstroms to about 1000 Angstroms.

20. The method of forming memory cell capacitors of claim 11 wherein the first conductive material comprises a transition metal silicide or a transition metal nitride, and the selected thickness of the first conductive material is from about 200 Angstroms to about 1000 Angstroms.

21. The method of forming memory cell capacitors of claim 11 wherein the first conductive material comprises TiN, and the selected thickness of the first conductive material is from about 200 Angstroms to about 1000 Angstroms.

22. The method of forming memory cell capacitors of claim 11 wherein steps "l"–"q" occur sequentially.

23. A method of forming memory cell capacitors comprising the following steps:

providing an array of electrically insulated word lines atop a semiconductor wafer;

defining first active regions adjacent the word lines for connection with memory cell capacitors;

defining second active regions adjacent the word lines for electrical connection with bit lines;

etching to expose the first active regions without use of photomasking;

depositing to a selected thickness a layer of first conductive material atop the wafer to conductively connect with the first active regions, the first conductive material being selectively etchable relative to silicon with silicon being selectively etchable relative to the first conductive material;

providing a layer of electrically conductive storage node polysilicon atop the layer of first conductive material;

etching the storage node polysilicon layer selectively relative to the first conductive material to define isolated capacitor storage nodes and exposed first conductive material;

depositing a layer of capacitor dielectric atop the isolated capacitor storage nodes;

providing a layer of electrically conductive cell polysilicon atop the capacitor dielectric layer; and selectively at least some of the etching exposed first conductive material from underlying substrate.

24. The method of forming memory cell capacitors of claim 23 wherein the first conductive material comprises a transition metal silicide or a transition metal nitride.

25. The method of forming memory cell capacitors of claim 23 wherein the first conductive material comprises TiN.

26. The method of forming memory cell capacitors of claim 23 wherein the selected thickness of the first conductive material is from about 200 Angstroms to about 1000 Angstroms.

27. The method of forming memory cell capacitors of claim 23 wherein the first conductive material comprises a transition metal silicide or a transition metal nitride, and the selected thickness of the first conductive material is from about 200 Angstroms to about 1000 Angstroms.

28. The method of forming memory cell capacitors of claim 23 wherein the first conductive material comprises TiN, and the selected thickness of the first conductive material is from about 200 Angstroms to about 1000 Angstroms.

* * * * *